United States Patent
Jang et al.

(10) Patent No.: US 7,144,798 B2
(45) Date of Patent: Dec. 5, 2006

(54) SEMICONDUCTOR MEMORY DEVICES HAVING EXTENDING CONTACT PADS AND RELATED METHODS

(75) Inventors: Se-Myeong Jang, Kyungki-do (KR); Yong-chul Oh, Kyungki-do (KR); Gyo-young Jin, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 305 days.

(21) Appl. No.: 10/446,480

(22) Filed: May 28, 2003

(65) Prior Publication Data
US 2004/0029372 A1 Feb. 12, 2004

(30) Foreign Application Priority Data
Aug. 7, 2002 (KR) .................. 10-2002-0046573

(51) Int. Cl.
*H01L 21/44* (2006.01)
*H01L 21/20* (2006.01)
*H01L 21/8242* (2006.01)

(52) U.S. Cl. .............. 438/597; 438/250; 438/256; 438/399

(58) Field of Classification Search ........ 438/250–256, 438/393–399, 597
See application file for complete search history.

(56) References Cited

U.S. PATENT DOCUMENTS

| | | | | |
|---|---|---|---|---|
| 5,679,599 A | * | 10/1997 | Mehta | 438/425 |
| 5,739,563 A | * | 4/1998 | Kawakubo et al. | 257/295 |
| 5,994,197 A | * | 11/1999 | Liao | 438/396 |
| 6,001,676 A | * | 12/1999 | Sawada et al. | 438/202 |
| 6,074,918 A | * | 6/2000 | Lee | 438/283 |
| 6,080,618 A | * | 6/2000 | Bergner et al. | 438/243 |
| 6,285,045 B1 | * | 9/2001 | Itabashi et al. | 257/211 |
| 6,437,382 B1 | * | 8/2002 | Yamazaki et al. | 257/298 |
| 6,461,959 B1 | * | 10/2002 | Chien et al. | 438/672 |
| 6,596,648 B1 | * | 7/2003 | Wu et al. | 438/745 |
| 6,610,580 B1 | * | 8/2003 | Chan et al. | 438/424 |
| 6,756,627 B1 | * | 6/2004 | Wu et al. | 257/306 |
| 2002/0068423 A1 | * | 6/2002 | Park et al. | 438/586 |

FOREIGN PATENT DOCUMENTS

JP  14-083943  3/2002
KR  1999-0077754  10/1999

OTHER PUBLICATIONS

Notice of Office Action, Korean Application No. 10-2002-0046573, May 28, 2004.

* cited by examiner

*Primary Examiner*—Chuong Anh Luu
(74) *Attorney, Agent, or Firm*—Myers Bigel Sibley & Sajovec

(57) ABSTRACT

An integrated circuit device having a semiconductor substrate includes a gate structure on the semiconductor substrate. Source/drain regions are on opposite sides of the gate structure. A contact pad is on at least one of the source/drain region, and a silicide cap is on a surface of the contact pad opposite the respective source/drain region.

58 Claims, 8 Drawing Sheets

SEMICONDUCTOR MEMORY DEVICES HAVING EXTENDING CONTACT PADS AND RELATED METHODS

RELATED APPLICATIONS

This application claims priority to Korean Patent Application No. 2002-46573, filed Aug. 7, 2002, in the Korean Intellectual Property Office, the disclosure of which is incorporated by reference herein in its entirety.

BACKGROUND OF THE INVENTION

1. Field of the Invention

The present invention relates to a semiconductor devices and related methods, and more particularly, to contact pad configurations and related methods.

2. Description of the Related Art

As semiconductor devices become more highly integrated, many changes and improvements have been made in the structure of capacitors and bit lines of semiconductor memory devices. In 256M DRAMs or greater, contacts for the connection of a drain and a storage electrode used as a lower electrode of a capacitor and the connection of a source and a bit line are typically formed by the formation of contact pads through a self-aligned process.

In such self-aligned formation of contacts and contact pads, a self-aligned contact pattern may be formed separately from the formation of gates, and contacts with the contact pads thereon may be formed between the gates using the self-aligried contact pattern as a mask. After formation of an inter-metallic dielectric film, contacts for the electrical connection of the bit line and the lower electrode of the capacitor may be formed in the inter-metallic dielectric film.

According to the above-described conventional methods, the lower electrode contact and the bit line contact are typically formed through different processes, resulting in many boundaries and a long contact path length. As a result, the contact resistance in a complete semiconductor memory device may be substantially high and short-circuiting may be likely to occur due to the introduction of dopants in the complicated manufacturing process. Therefore, the conventional techniques may lower the yield and reliability of semiconductor memory devices produced thereby.

SUMMARY OF THE INVENTION

According to embodiments of the invention, an integrated circuit device having a semiconductor substrate is provided. A gate structure is on the semiconductor substrate, and source/drain regions are on opposite sides of the gate structure. A contact pad is on at least one of the source/drain region, and a silicide cap is on a surface of the contact pad opposite the respective source/drain region.

Further embodiments of the invention provide a semiconductor substrate having a gate structure. The gate structure includes a gate insulating layer on the semiconductor substrate, a conductive gate electrode on the gate insulating layer opposite the semiconductor substrate, and an insulating mask layer on the conductive gate electrode opposite the semiconductor substrate. Source/drain regions are on opposite sides of the gate structure. A contact pad is on at least one of the source/drain regions, and the contact pad extends further from the substrate than the insulating mask layer.

Accordingly, embodiments of the invention may provide reduced contact path length and contact resistance in capacitor contacts and bit line contacts. Electrical contact conductivity and productivity may be improved.

According to further embodiments of the invention, a gate structure is formed on a semiconductor substrate. Source/drain regions are formed on opposite sides of the gate structure. The gate structure includes a gate insulating layer on the semiconductor substrate, a conductive gate electrode on the gate insulating layer opposite the semiconductor substrate, and an insulating mask layer on the conductive gate electrode opposite the semiconductor substrate. A contact pad is formed on at least one of the source/drain regions so that the contact pad extends further from the substrate than the insulating mask layer.

Other embodiments of the invention include forming a gate structure on a semiconductor substrate. Source/drain regions are formed on opposite sides of the gate structure. A contact pad is formed on at least one of the source/drain regions. A silicide cap is formed on a surface of the contact pad opposite the respective source/drain region.

Certain embodiments of the invention include forming an isolation insulating layer in a semiconductor substrate to define a cell area and a peripheral circuit area and to define a device region in the cell area and the peripheral circuit area. Next, a gate is formed in the device region, and source and drain regions are defined. An interlevel dielectric layer is formed on the gate and the source and drain regions and subjected to planarization. A self-aligned pattern is formed on the interlevel dielectric layer, and self-aligned contacts exposing the source and drain regions only in the cell area are formed using a self-aligned process. Contact pads are formed by filling the self-aligned contacts with a conductive layer. Next, the conductive layer of the contact pads is thermally processed. The interlevel dielectric layer in the peripheral circuit area is fully removed, and junctions are formed by implanting ions into the source and drain regions in the peripheral circuit area. Next, a metal silicide layer is formed on at least one of the contact pads and the source and drain regions of the peripheral circuit area.

Other embodiments of the invention provide an isolation insulating layer defining a cell area and a peripheral circuit area in a semiconductor substrate and defining a device region in the cell area and the peripheral cell area. MOS transistors having sources, drains, and gates are formed in the device region. Contact pads are disposed between and protrude above the gates. The tops of the contact pads are connected to one of the sources and drains. Silicide caps are formed on the tops of the contact pads. Contact fills are connected to the silicide caps. Capacitors are formed above the contact pads connected to the sources. Bit lines are connected to the contact pads connected to the drains.

DETAILED DESCRIPTION OF THE INVENTION

Figure 1:
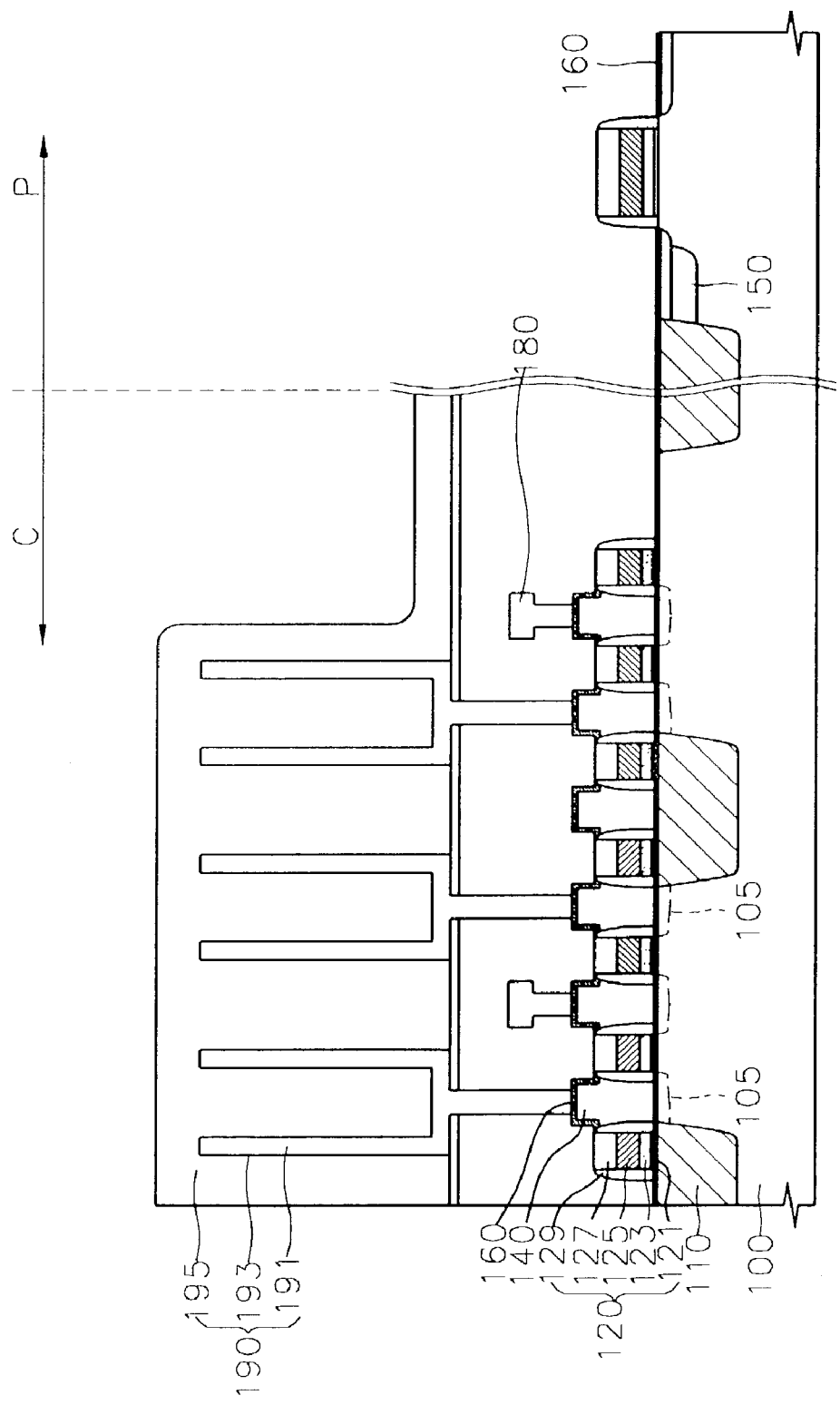
FIG. 1 is a cross-sectional view of a semiconductor memory device according to embodiments of the present invention.

The present invention now will be described more fully hereinafter with reference to the accompanying drawings, in which various embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes and/or thicknesses of elements and/or layers may be exaggerated for clarity. When a layer is described as being on another layer or a semiconductor substrate, the layer may be directly on the other layer or semiconductor substrate, or other layers may be interposed therebetween. In contrast, when an element is referred to as being "directly on" another element, there are no intervening elements present. Like reference numerals in the drawings denote like members.

A sectional view of a semiconductor memory device according to embodiments of the present invention is shown in FIG. 1. Referring to FIG. 1, the semiconductor memory device includes an isolation insulating layer 110 defining device regions in a cell area C and a peripheral circuit area P on a semiconductor substrate 100. A gate dielectric layer 121 is formed on the cell area C and the peripheral circuit area P. The gates 120 each include gate conductive layers 123 and 125, an insulating mask layer 127 on the gate conductive layers 123 and 125. Insulating sidewall spacers 129 and a source/drain junction 150 are formed on both sides of the gate 120 in the device region. A contact pad 140 is formed in cylindrical form between the gates 120 using a self-aligned method. A silicide cap 160 is formed on the contact pad 140. A bit line 180 and a capacitor 190 contact the top of the silicide cap 160.

The isolation insulating layer 110 can be a silicon oxide layer formed using a trench isolation method and/or a chemical deposition method. Both the gate conductive layers 123 and 125 may be formed of doped polysilicon. In an alternative, one gate conductive layer 125 may be formed of metal silicide to reduce a sheet resistance in highly integrated devices having narrow line widths. Suitable metal silicides for the gate conductive layer 125 include tungsten silicide (WSi), titanium silicide (TiSi), cobalt silicide (CoSi), molybdenum silicide (MoSi), and/or combinations thereof.

Contact pads 140 are connection portions that make contact between respective source/drain junctions 105 in the semiconductor substrate 100 and lower electrodes 191 of capacitors 190 or bit lines 180, as shown in FIG. 1. The contact pad 140 can be formed of a conductive, doped polysilicon to fill the contact hole. The contact pad 140 can be formed to protrude above the top of the gate 120 to provide a large upper contact area.

The silicide cap 150 can be formed of metal silicide to cover the upper protruding portion of the contact pad 140 and the silicide cap may lower the contact resistance. Suitable metal silicides for the silicide cap 150 include TiSi, MoSi, CoSi, and/or combinations thereof.

FIGS. 2 through 10 are cross-sectional views illustrating steps of semiconductor memory device manufacturing methods according to embodiments of the present invention.

Figure 2:
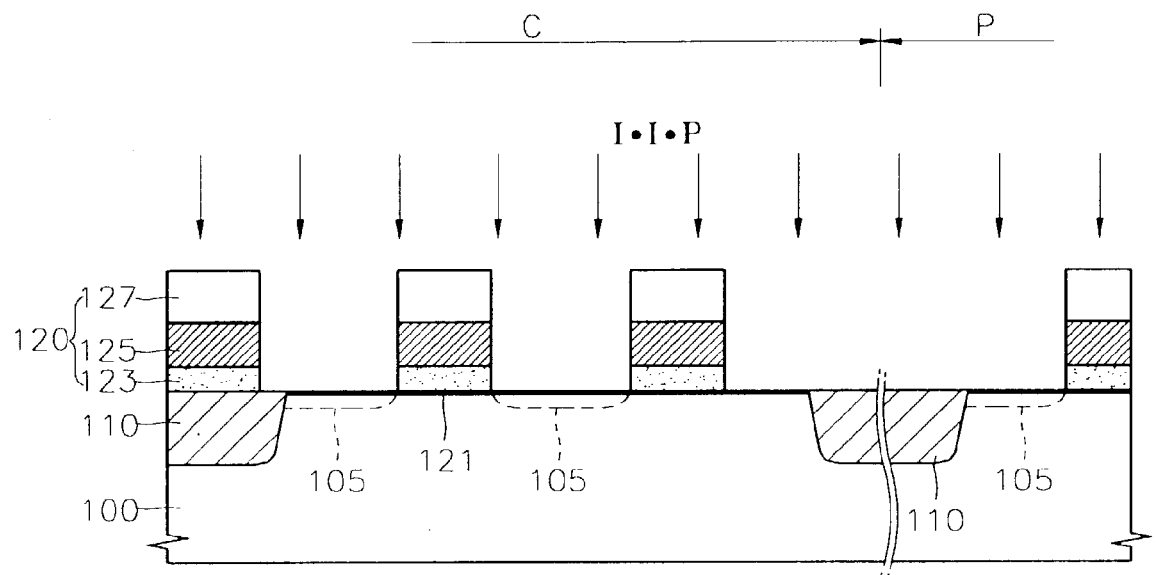
FIGS. 2 through 10 are cross-sectional views illustrating steps of fabricating integrated circuit devices according to embodiments of the present invention.

Referring to FIG. 2, after an insulating mask layer is formed on a semiconductor substrate 100 (such as a silicon substrate), and an isolation pattern can be formed in the insulating mask layer using a predetermined patterning process. A trench, which is illustrated in FIG. 2 as being filled with an isolation insulating layer 110, can be formed in the semiconductor substrate 100 using the isolation pattern as a mask. A relatively thick insulating layer can be formed on the semiconductor substrate 100 in and above the trench, followed by planarization, such as chemical mechanical polishing (CMP), so that a planarized insulating layer remains only in the device region. Next, wet etching can be performed to remove the insulating mask layer thereby exposing device regions between isolating insulating layers 110. The isolation insulating layers 110 may comprise silicon oxide formed by chemical vapor deposition (CVD) because silicon oxide may provide good flow characteristics for filling the trench.

Next, a gate dielectric layer 121 is formed on the semiconductor substrate 100. In the device region, and gate conductive layers 123 and 125 and insulating mask layer 127 are sequentially formed. The gate conductive layers 123 and 125 and the insulating mask layer 127 can be patterned to provide a gate pattern using a predetermined gate patterning process. The gate dielectric layer 121 may be a silicon oxide or silicon oxynitride (SiON) thin film formed by oxidation of the substrate 100. Both the gate conductive layers 123 and 125 may be formed of doped polysilicon. In an alternative, one of the gate conductive layers 123 and 125 can be formed of metal silicide having low resistivity to lower a sheet resistance in highly integrated devices. In other words, a doped polysilicon layer can be deposited as the gate conductive layer 123 on the gate dielectric layer 121 using CVD, and a metal silicide layer is deposited thereon as the gate conductive layer 125. The metal silicide gate conductive layer 125 can be formed of a tungsten silicide layer using CVD. Alternatively, the metal silicide gate conductive layer 125 may be formed of TiSi, MoSi, and/or CoSi using a predetermined silicide formation method.

The insulating mask layer 127 can be used as a self-aligned mask in forming a self-aligned contact by etching, and the insulating mask layer 127 may protect the underlying gate conductive layers 123 and 125 and the gate dielectric layer 121. The insulating mask layer 127 may be formed of, for example, a silicon nitride ($Si_3N_4$) layer, which may have high etch selectivity with respect to a silicon dioxide ($SiO_2$) layer deposited later as an interlevel dielectric layer 130 (see FIG. 4) when a self-aligned contact is formed by etching.

After the gate pattern has been formed on the semiconductor substrate 100, N-type dopants are implanted into the source/drain region in the cell area C and the peripheral circuit area P of the semiconductor substrate 100 to a relatively low doping concentration using the gate pattern as a mask to form an $N^-$ junction 105. Here, phosphorous (P) or arsenic (As) may be used as the N-type dopants for the $N^-$ junction 105. The $N^-$ junction 105 acts as a source/drain junction in the cell area C and as an enhanced junction, for example, an ion channel, in the peripheral circuit area P.

Figure 3:
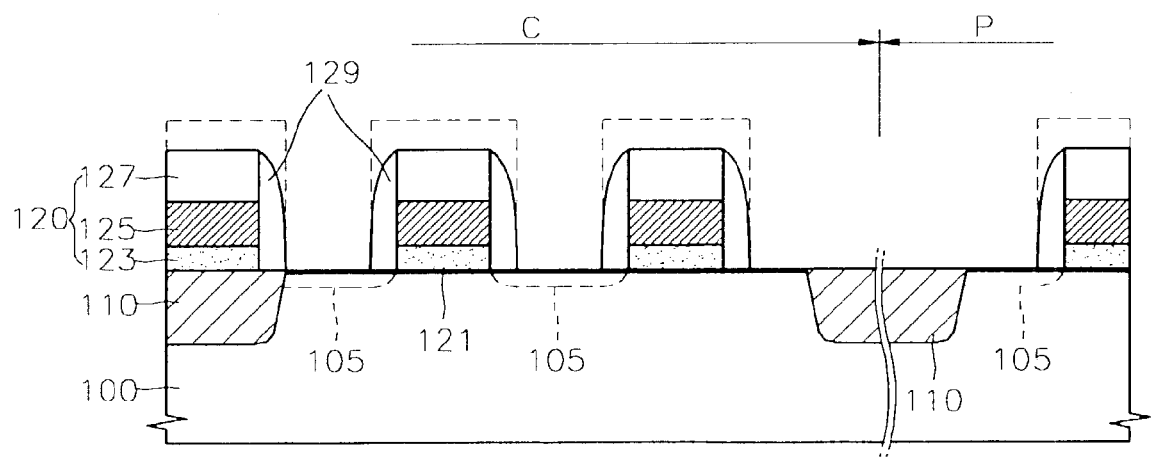

Referring to FIG. 3, an insulating spacer 129 is formed on the sidewalls of the gate pattern, which includes the gate conductive layers 123 and 125 and the insulating mask layer 127. In particular, a silicon nitride layer can be formed on the entire surface of the semiconductor substrate 100 and the gates 120 and etched back by dry etching to form the insulating spacer 129 on the sidewalls of the gate conductive layers 123 and 125 and the insulating mask layer 127. The silicon nitride layer can be formed by CVD, and more particularly, low pressure chemical vapor deposition (LPCVD) to provide resistance to dry and wet etching. The resulting insulating spacers 129 on the gate pattern sidewalls can be wide enough to provide an effect of increasing the length of the gate channel between the source and the drain. As a result, a short channel effect may be reduced, and device characteristics, such as threshold voltage stability, may be improved.

Figure 4:
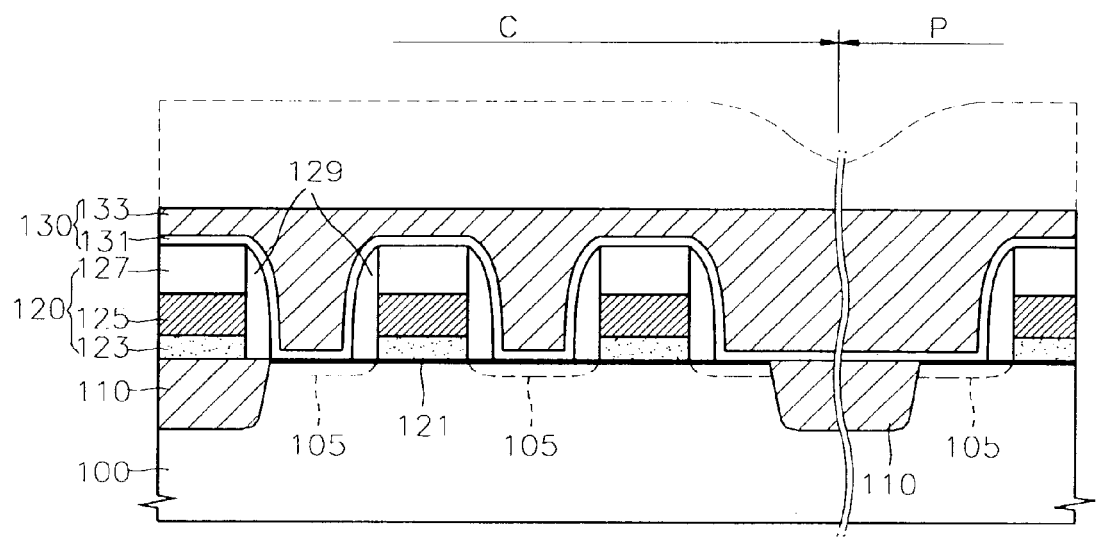

Referring to FIG. 4, the interlevel dielectric layer 130 can be formed over the semiconductor substrate 100 and removed to a predetermined thickness level by planarization.

The interlevel dielectric layer 130 may include an etch stopper 131. For example, a silicon nitride layer as the etch stopper 131 and a silicon oxide layer 133 may be sequentially formed on the underlying layers. The interlevel dielectric layer 130 may be formed using CVD. The silicon nitride etch stopper 131 can be formed using LPCVD or plasma enhanced chemical vapor deposition (PECVD). The silicon oxide layer 133 may be formed using plasma enhance chemical vapor deposition (PECVD) or high density plasma chemical vapor deposition (HDPCVD) that can result in a relatively high deposition rate and filling characteristics. The interlevel dielectric layer 130 may fill recessions between the gate patterns and may planarize the surface of the semiconductor substrate 100.

Next, a portion of the interlevel dielectric layer 130 can be removed to be planar through a planarization process. Dry etch-back and CMP may be applied in the planarization process. Dry etch-back may be achieved by bombarding a target layer to be etched with reactive ions or plasma. As a result, the gate dielectric layer 121 on the semiconductor substrate 100 or the source/drain junction 105 may be prone to plasmic physical damage. For this reason, planarization of the interlevel dielectric layer 130 may be performed using CMP, which may cause less physical damage. When the interlevel dielectric layer 130 is removed through planarization, the polishing process may be stopped a predetermined height above the insulating mask layer 127 of the gate 120 such that a predetermined amount of the interlevel dielectric layer 130 remains on the insulating mask layer 127. This can allow a contact pad 140 having a large upper contact area to be formed in a subsequent process.

Figure 5:
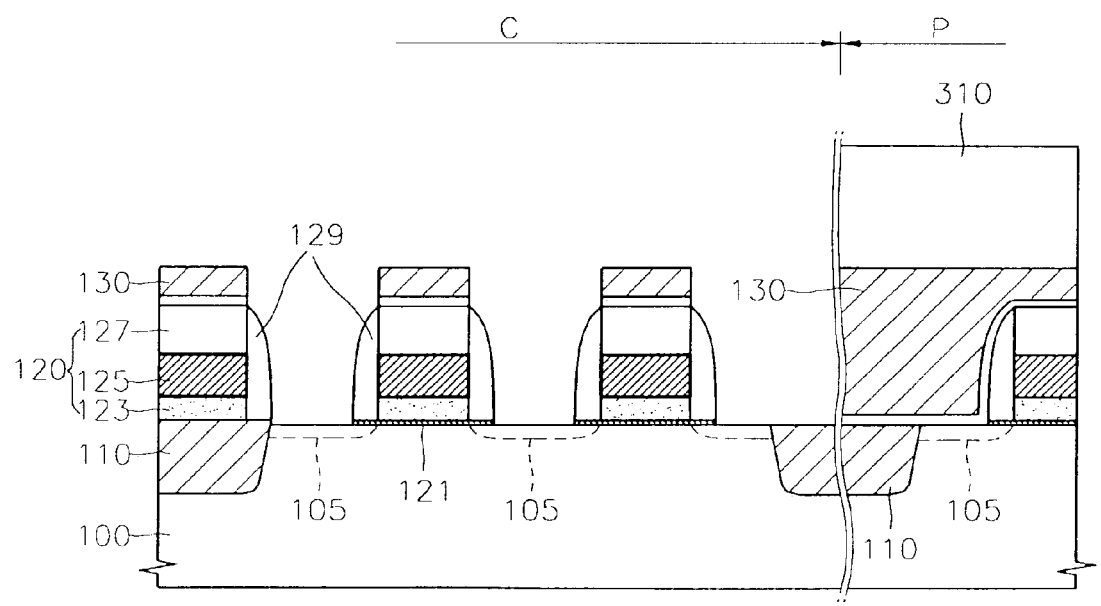

Referring to FIG. 5, a self-aligned pattern (not shown) can be formed in the cell area C using a photoresist 310 while the peripheral circuit area P is covered with the photoresist 310. The interlevel dielectric layer 130 in the source/drain regions 105 of the cell area C can be fully removed using the self-aligned pattern and the gates 120 as a mask, resulting in a self-aligned contact opening. Here, a linear or bar-type self-aligned contact pattern may be formed in a direction in which gate lines extend, so that a space for a predetermined contact pad 140 (see FIG. 6) can be defined in the source/drain regions 105 of the cell area C. Exposed portions of the silicon oxide layer 133 and the etch stopper 131 of the interlevel dielectric layer 130 are removed using the insulating spacers 129, which can be formed of a silicon nitride layer, on the gates 120 and the insulating mask layers 127 of the gates 120 as an etch mask. As a result, source/drain regions 105 of the semiconductor substrate 100 are exposed in the cell area C, and the interlevel dielectric layer 130 remains in the cell area C only on the insulating mask layers 127 of the gates 120. At this time, since the peripheral circuit area P is covered with the photoresist 310, the interlevel dielectric layer 130 in the peripheral circuit area P remains.

Figure 6:
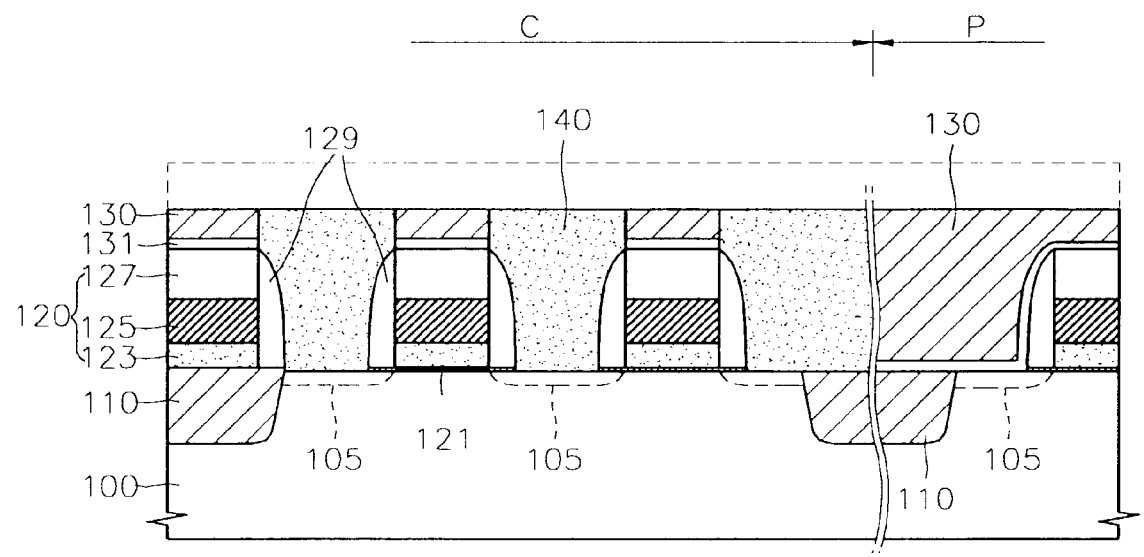

Referring to FIG. 6, a doped polysilcon can be deposited in and above the self-aligned contact opening to form a conductive layer. Portions of the conductive layer can be removed using CMP to be level with the height of the remaining interlevel dielectric layer 130. As a result, the contact pad 140 can be formed in the source/drain regions of the cell area C while the interlayer insulating layer 130 remains in the peripheral circuit area P. Next, the contact pad 140 can be annealed above a temperature sufficient to cause annealing to enhance the conductivity of the doped polysilicon.

The semiconductor substrate 100 can be loaded into a thermal processing apparatus for annealing. A temperature within the thermal processing apparatus can be raised to a sufficient temperature which is maintained for sufficient duration of time in an inert gas atmosphere, for example, containing argon (Ar), nitrogen (N2), etc., to cause the desired annealing. As a result, the temperature of the semiconductor substrate 100 may rise by heat absorption, and consequently, the temperature of the doped polysilicon of the contact pad 140 rises, which may activate the dopants and lower the conductivity of the contact pad 140. A tube-equipped furnace or a single wafer type rapid thermal processor may be used for the thermal processing apparatus. The annealing temperature may be in the range of about 800° C. to about 900° C. Dopants in the polysilicon, such as trivalent boron or pentavalent phosphorous ions, can be effectively activated in that temperature range without diffusing out.

Figure 7:
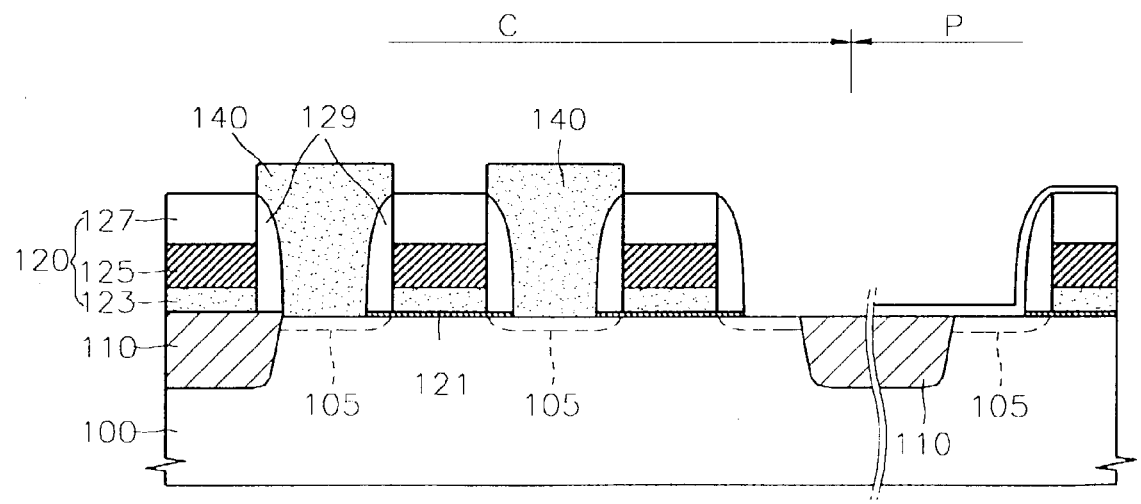

Referring to FIG. 7, portions of the interlevel dielectric layer 130 remaining on the insulating mask layers 127 and in the peripheral circuit area P can be removed using a wet etchant. Since the etch stopper 131 (formed in a lower portion of the interlevel dielectric layer 130) can be a silicon nitride layer, an oxide ethant containing fluoric acid (HF) can be used so that only the exposed silicon oxide layer 133 of the interlevel dielectric layer 130 is etched away while the etch stopper 131 remains unetched protecting the underlying gates 120 and source/drain junction 105 from damage. As a result, the gates 120 and the contact pads 140 protruding above the gates 120 remain in the cell area C, while the gate 120, the gate insulating layer 121 in the source/drain region, and the etch stopper 131 formed of silicon nitride remain in the peripheral circuit area P.

Figure 8:
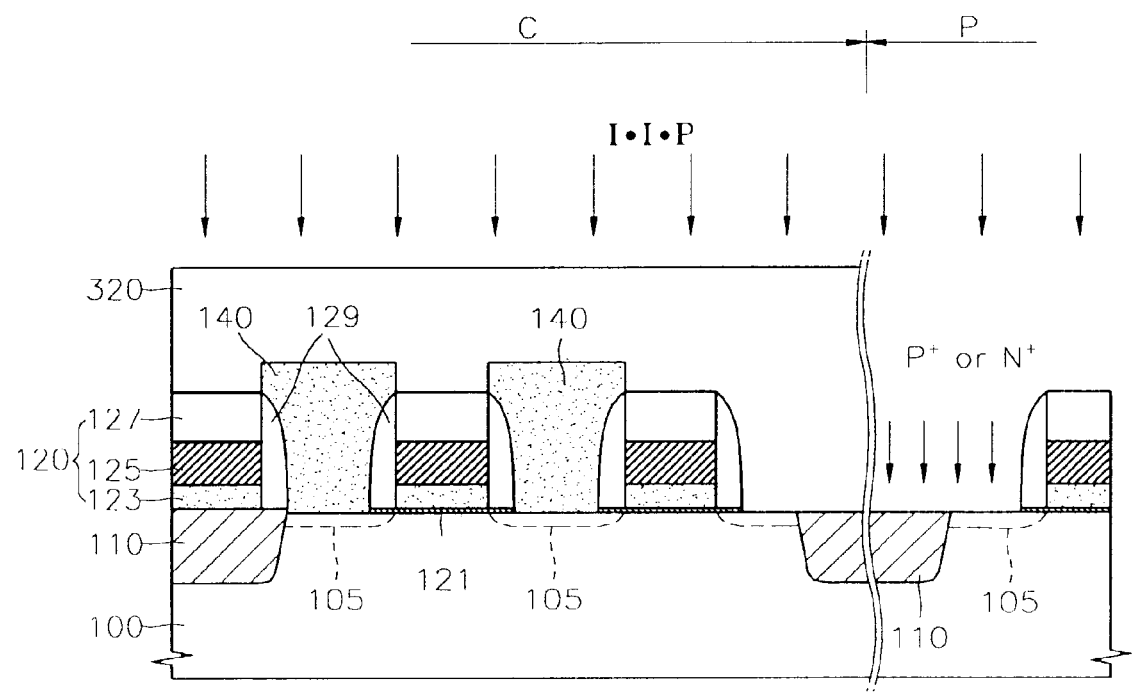

Referring to FIG. 8, a source/drain junction 150 can be formed in the isolation region of the peripheral circuit area P through a photolithography and ion implantation process.

The peripheral circuit area P includes an NMOS region and a PMOS region so that ion implantation for the source/drain junction 150 may be performed separately for the NMOS and PMOS regions. For an NMOS junction, a pattern blocking a PMOS region can be formed using a photoresist 320, and N-type ions selected from the group consisting of P, As, and Sb ions can be implanted into a source/drain region for the NMOS junction. For a PMOS junction, a pattern blocking the NMOS region can be formed using the photoresist 320, and P-type dopants such as B or $BF_2$ ions can be implanted into a source/drain region for the PMOS junction. As a result, the source/drain junctions 150 can be formed in the PMOS and NMOS regions of the peripheral circuit area P.

Figure 9:
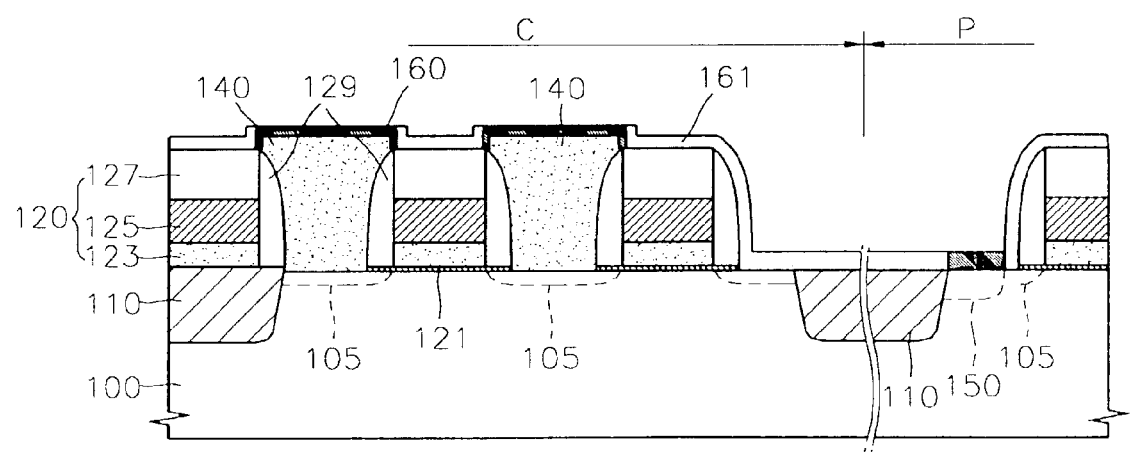
Figure 10:
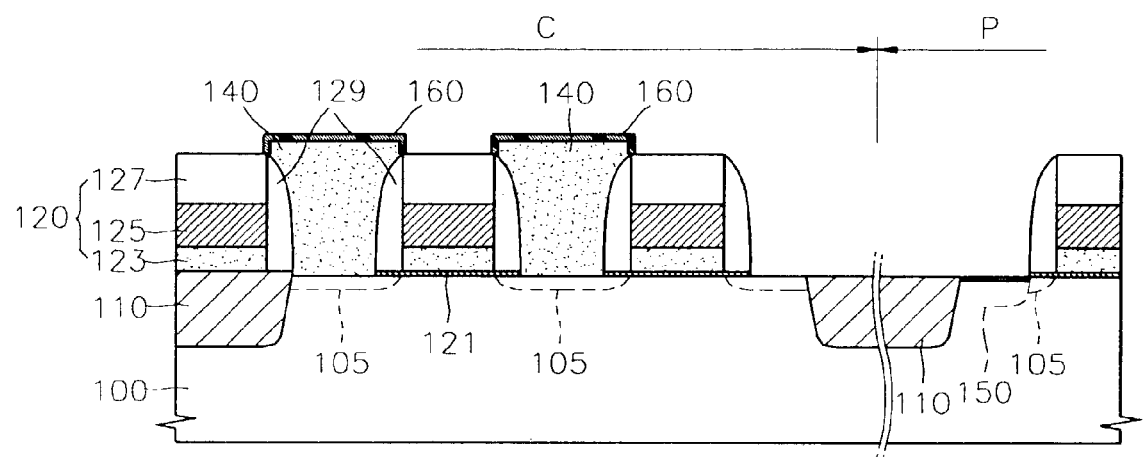

Referring to FIGS. 9 and 10, a silicide-source metal layer 161 can be formed over the semiconductor substrate 100, followed by a predetermined thermal silicidation process to form a metal silicide layer 160 in a region where the silicide-source metal layer 161 contacts a silicon source. Next, the unreacted silicide-source metal layer 161 can be removed using wet etching.

Metals liable to a thermal silicide formation reaction with silicon atom are used for the silicide-source metal layer 161.

For example, the silicide-source metal layer 161 may be formed of a metal selected from the group consisting of Ti, Co, Mo, and/or Ni.

A thermal silicidation process is performed above a temperature and for a period of time sufficient for silicidation to occur. A rapid thermal process may be applied in the thermal silicidation process. Thermal degradation of the metal silicide layer 160 can be reduced in a rapid thermal process due to relatively short ramping-up and ramping-down durations.

Once the thermal silicidation process has been completed, the metal silicide layer 160 results in the region where the silicide-source metal layer 160 contacts a silicon source, i.e., on the top of the contact pad 140 in the cell area C and/or in the source/drain region of the peripheral circuit area P, through the silicidation reaction between polysilicon silicon of substrate 100 and the silicide-source metal layer 161. The resulting metal silicide layer 160 may be a TiSi, MoSi, and/or CoSi layer, depending on the kind of the silicide-source metal used. A portion of the silicide-source metal layer 161 formed on an insulating layer, such as silicon oxide or silicon nitride layer, may remain unreacted.

The unreacted silicide-source metal layer 161 can be removed, as shown in FIG. 10, using wet etching, for example, in ammonium hydroxide ($NH_4OH$) or sulfuric acid ($H_2SO_4$) solution. Through the wet etching process, the unreacted silicide-source metal layer 161 can be completely removed while only the metal silicide layer 160 remains on the contact pad 140 and in the source/drain region of the peripheral circuit area P.

Next, a bit line (180 in FIG. 1) and a capacitor (190 in FIG. 1) can be formed. Metal lining and passivation processes may also be performed.

FIGS. 11 through 15 are cross-sectional views illustrating semiconductor memory device manufacturing methods according to further embodiments of the present invention. The processes prior to formation of the contact pad 140 of FIG. 7 may be performed as described above. Next, the following processes may be performed.

Figure 11:
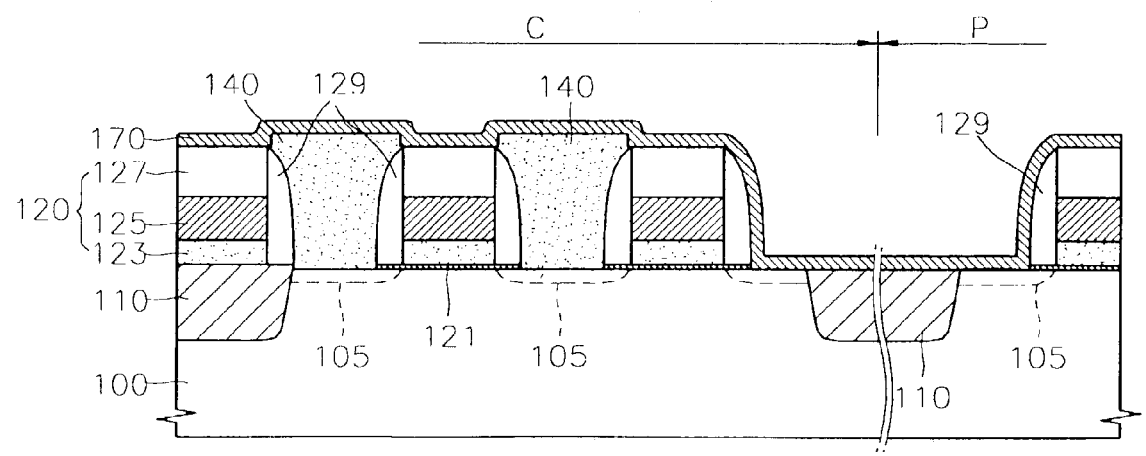
FIGS. 11 through 15 are cross-sectional views illustrating steps of fabricating integrated circuit devices according to further embodiments of the present invention.
Figure 12:
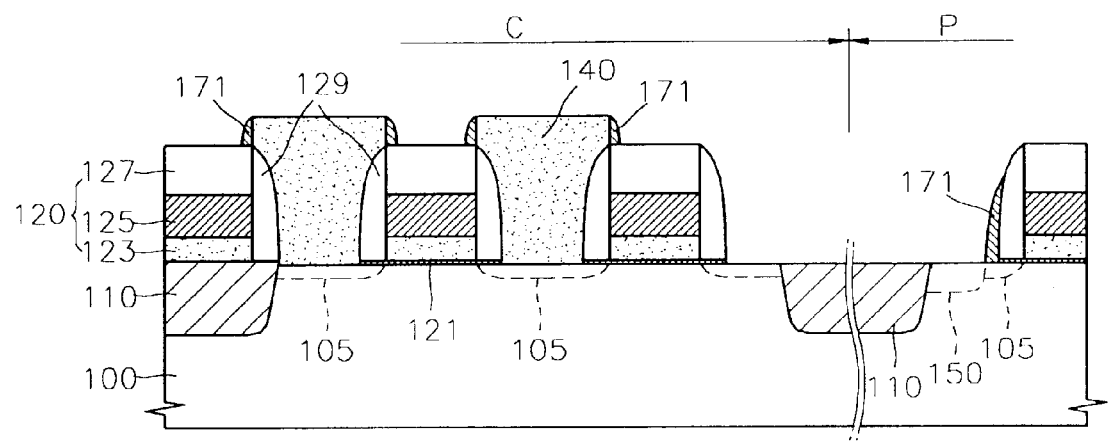

After the formation of the contact pad 140 of FIG. 7, referring to FIGS. 11 and 12, the top of the contact pad 140 can protrude between the gates 120 above the mask insulating layers 127. The contact pads 140 and the source/drain region in the peripheral circuit area P are exposed. Next, auxiliary spacers 171 can be formed on the sidewalls of the contact pad 140 and exposed insulating spacers 129 of gates 120. An insulating layer, such as silicon oxide, can be formed on the surface of the semiconductor substrate 100, including gates 120 and contact pads 140, and etched back using dry etching. As a result, the auxiliary spacers 171 can be formed on the upper sidewalls of the contact pad 140 and on the exposed insulating spacers 129 of the gates 120 in the peripheral circuit area P. The presence of the auxiliary spacers 171 provides an effect of extending the channel length of the gate 120 by the width of the auxiliary spacer 171 in a subsequent ion implantation process for the $N^+$ and/or $P^+$ source/drain junction 150. Therefore, in a highly integrated memory device having a very narrow gate line width, short channel effects between source/drain junctions of transistors can be reduced.

Figure 13:
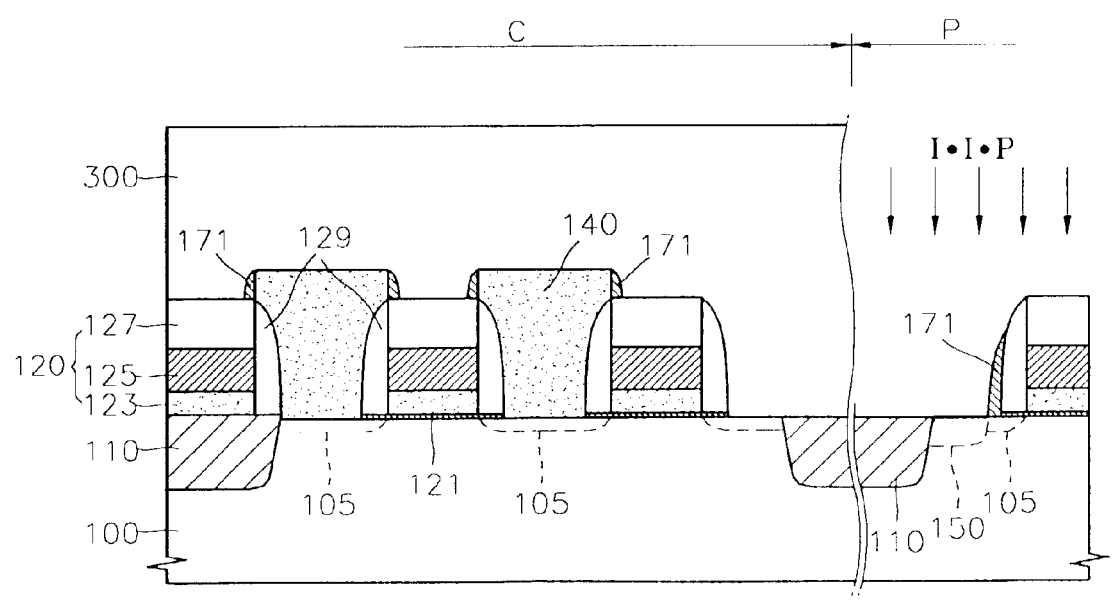

Referring to FIG. 13, the source/drain junction 150 can be formed in the NMOS and PMOS regions of the peripheral circuit area P. In order to form $N^+$ junctions 150 in NMOS regions of the peripheral circuit area P, a photoresist pattern blocking the cell area C and the PMOS regions of the peripheral circuit area P can be formed, and N-type ions, such as P or As ions, can be implanted into the NMOS source/drain regions to a high concentration. Subsequently, in order to form $P^+$ junctions 150 in PMOS regions of the peripheral circuit area P, a photoresist pattern blocking the cell area C and NMOS regions of the peripheral circuit area P can be formed, and P-type ions, such as B or $BF_2$ ions, can be implanted into the PMOS region to a high concentration. As a result, the $N^+$ and $P^+$ source/drain junctions 150 can be formed in the source/drain regions on both sides of gates 120, resulting in transistors in the peripheral circuit area P.

Figure 14:
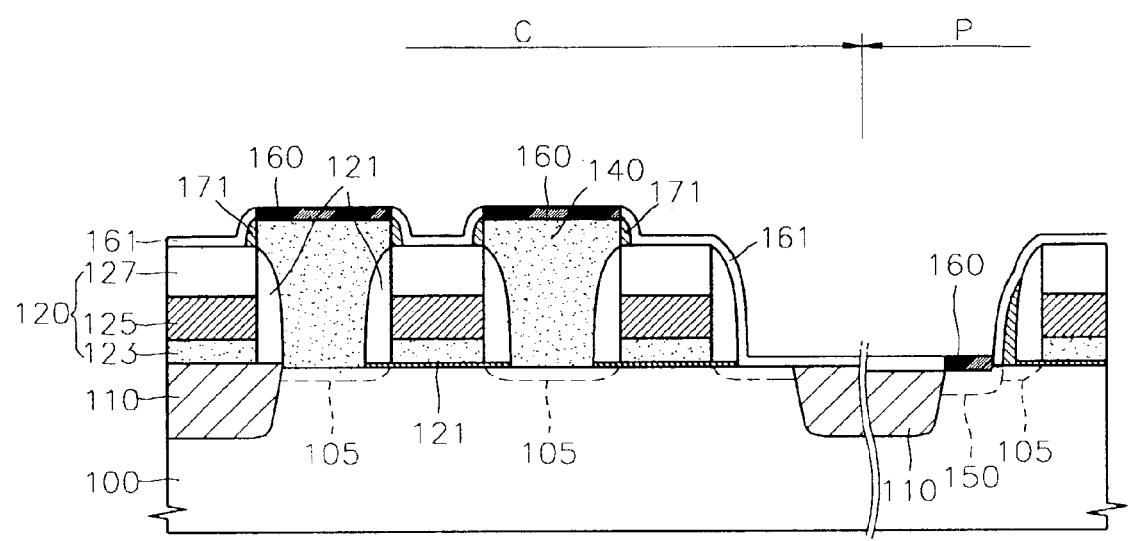

Referring to FIG. 14, the silicide-source metal layer 161 can be formed on the entire surface of the semiconductor substrate 100 and subjected to a predetermined thermal silicidation process to form the metal silicide layer 160 in a region where the silicide-source metal layer 161 contacts a silicon source. Ti, Mo, Co, and/or Ni may be used for the silicide-source metal layer 161. In this case, a TiSI, MoSi, CoSi, and/or NiSi layer can be formed as the metal silicide layer 160.

A rapid thermal process or furnace annealing may be applied in the thermal silicidation process. A rapid thermal process may reduce degradation of the metal silicide layer 160.

Figure 15:
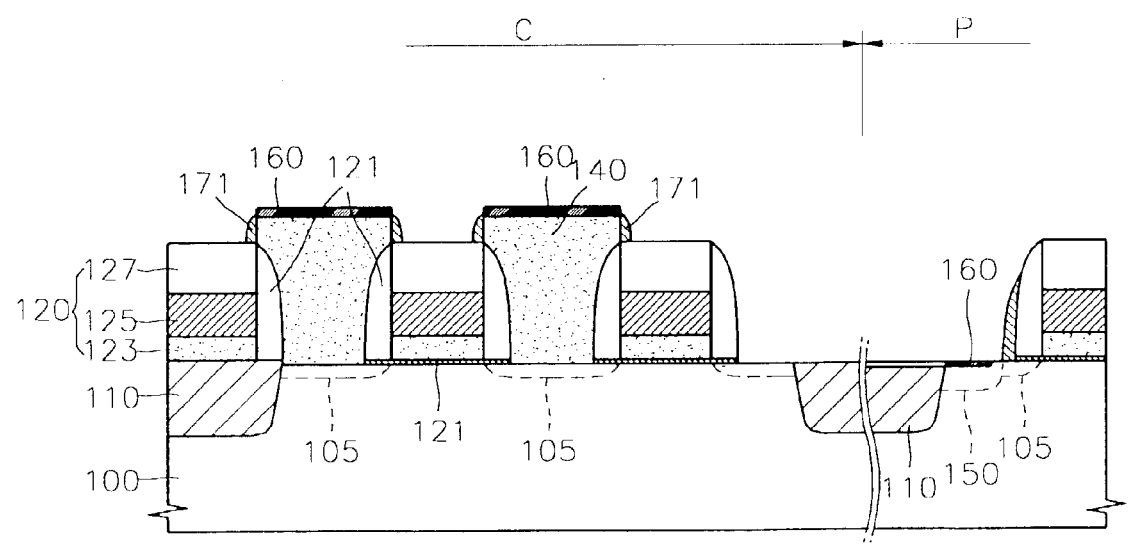

A portion of the silicide-source metal layer 161 may remain unreacted on the semiconductor substrate 100. This portion of the silicide-source metal layer 161 can be removed using an etching method, for example, wet etching, as shown in FIG. 15. An ammonium hydroxide (NH4OH) or sulfuric acid ($H_2SO_4$) solution may be used as a wet etchant. As a result, the remaining unreacted silicide-source metal layer 161 is removed while the metal silicide layer 160 on the top of the contact pad 140 and in the source/drain region of the peripheral circuit area P remain.

As described above, the contact pad 140 may protrude above the gates 120 and can be connected via the conductive metal silicide layer 160 to the bit line 180 (see FIG. 1) and the capacitor 190 (see FIG. 1). Accordingly, bit line failure or soft (point) failure resulting from the high contact resistance in the contact region can be reduced, which may improve the yield of semiconductor memory devices. Since annealing of the conductive polysilicon of the contact pad 140 can be performed after formation of the contact pad 140 and before formation of the $N^+$ or $P^+$ source/drain junctions 150, the source/drain junctions 150 may not be exposed to an extra amount of thermal energy for annealing. Therefore, the source/drain junction 150 may remain relatively shallow. Degradation of the source/drain junction 150 in the peripheral circuit area P and the metal silicide layer 160 may be reduced.

In the above embodiments, the metal silicide layer 160 can be formed simultaneously on the contact pads 140 and in the source/drain junctions of the peripheral circuit area P. However, the metal silicide layer 160 can be formed only on the contact pad 140 or only in the source/drain junction 150 of the peripheral circuit area P.

In particular, after the silicon oxide layer (used as an insulating blocking layer) is formed over the semiconductor substrate 100, as illustrated in FIG. 11, a photoresist pattern blocking only the cell area C may be formed. The silicon oxide insulating layer in the peripheral circuit area P may be etched back into auxiliary spacers 171 (see FIG. 12) using dry etching. The auxiliary spacers 171 may be formed on the sidewalls of the gate 120 in the peripheral circuit area P while the contact pad 140 in the cell area C is blocked by the insulating blocking layer. Subsequently, the thermal silicidation process as described above can be performed so that the metal silicide layer 160 is formed only in the source/ drain junction 150 of the peripheral circuit area P while no metal silicide layer is formed on the blocked contact pad 140.

Alternatively, the metal silicide layer may-be formed only on the contact pad 140. After the process illustrated in FIG. 11, the peripheral circuit area P may be blocked using a photoresist pattern. The silicon oxide insulation layer in the cell area C may be etched back to expose the top of the contact pad 140 and to form auxiliary spacers 171 on the upper sidewalls of the contact pad 140, while the source/drain junctions 150 of the peripheral circuit area P is blocked. Subsequently, the thermal silicidation process as described above may be performed so that the metal silicide layer 160 is formed only on the contact pad 140 in the cell area C.

As described above, in semiconductor memory device manufacturing methods according to embodiments of the present invention, the metal silicide layer 160 can be formed selectively either in the cell area C or the peripheral circuit area P.

According to embodiments of the invention, the area of the upper portion of the contact pad may be increased and/or coated with metal silicide. In this configuration, connections to a capacitor contact and a bit line contact may be improved. The contact resistance may be lowered, thus improving the properties of the capacitor or transistor. The sheet resistance in the contact region with the capacitor and bit line may be reduced, so that failure and yield reduction due to a high contact resistance can be reduced, increasing electrical reliability and productivity.

In addition, after the contact pad is formed of doped polysilicon, the doped polysilcon may be annealed before high-concentration ion implantation for the source/drain junction of the peripheral circuit area. As a result, a shallow junction necessary for highly integrated semiconductor memory devices may be formed.

The metal silicide layer can be formed simultaneously on the contact pad in the cell area and/or in the source/drain region of the peripheral circuit area by appropriately using an insulating blocking layer, thereby simplifying the manufacturing process.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, the method comprising:
   (a) forming a gate structure on a semiconductor substrate;
   (b) forming source/drain regions on opposite sides of the gate structure, wherein the gate structure comprises a gate insulating layer on the semiconductor substrate, a conductive gate electrode on the gate insulating layer opposite the semiconductor substrate, and an insulating mask layer on the conductive gate electrode opposite the semiconductor substrate; and
   (c) forming a contact pad on at least one of the source/drain regions so that the contact pad extends farther from the substrate than the insulating mask layer wherein step (c) further comprises:
   (d) forming a dielectric layer on the gate structure before forming the contact pad;
   (e) after forming the contact pad, removing the dielectric layer to expose a sidewall of a portion of the contact pad that protrudes above the gate structure; and
   (f) forming a silicide layer on the contact pad.

2. The method of claim 1, wherein the dielectric layer is formed on the source/drain region in step (b), further comprising: selectively removing the dielectric layer from the source/drain region.

3. The method of claim 1, wherein the gate structure is formed on a first region of the semiconductor substrate, the method further comprising forming another source/drain region in a second region of the semiconductor substrate after forming the silicide layer.

4. The method of claim 1, wherein the silicide layer is a metal silicide layer.

5. The method of claim 4, wherein the metal silicide comprises at least one of titanium silicide, molybdenum silicide, and cobalt silicide.

6. The method of claim 1, wherein forming the silicide layer comprises forming a metal layer on the contact pad and reacting the metal layer with the contact pad to convert a portion of the contact pad into a silicide.

7. The method of claim 1, wherein forming a silicide layer comprises:
   forming a silicide-source metal layer on the contact pad; and
   thermally processing the semiconductor substrate at a temperature sufficient to change a portion of the silicide-source metal layer into a metal silicide layer.

8. The method of claim 7, further comprising removing an unchanged portion of the silicide-source metal layer after thermal processing.

9. The method of claim 7, wherein the silicide-source metal layer is formed from at least one of titanium, molybdenum, cobalt, and nickel.

10. The method of claim 8, wherein removing the unchanged portion of the silicide-source metal layer comprises wet etching using a metal etchant.

11. The method of claim 1, further comprising forming spacers on a portion of the contact pad that extends further from the substrate than the insulating mask layer.

12. A method of forming an integrated circuit device, the method comprising:
   (a) forming a gate structure wherein the gate structure comprises a gate insulating layer on the semiconductor substrate, a conductive gate electrode on the gate insulating layer opposite the semiconductor substrate, and an insulating mask layer on the conductive gate electrode opposite the semiconductor substrate on a semiconductor substrate;
   (b) forming source/drain regions on opposite sides of the gate structure;
   (c) forming a contact pad on at least one of the source/drain regions; and
   (d) forming a silicide cap on a surface of the contact pad opposite the respective source/drain region so that the contact pad and the silicide cap thereon extend farther from the substrate than the insulating mask; wherein a portion of the contact pad protrudes into the silicide cap and extends farther from the substrate that a portion of the silicide cap.

13. The method of claim 12, wherein forming the silicide cap comprises forming a metal layer on the contact pad and reacting the metal layer with the contact pad to convert a portion of the contact pad into a silicide.

14. The method of claim 12, wherein forming the silicide cap comprises forming a silicide-source metal layer on the contact pad, and then, thermally processing the semiconductor substrate at a temperature sufficient to change a portion of the silicide-source metal layer into a metal silicide layer.

15. The method of claim 12, wherein the gate structure is formed on a first region of the semiconductor substrate, the method further comprising after step (d), forming another source/drain region in a second region of the semiconductor substrate.

16. The method of claim 12, wherein the metal silicide layer comprises at least one of titanium silicide, molybdenum silicide, and cobalt silicide.

17. The method of claim 12, further comprising removing an unchanged portion of the silicide-source metal layer after thermal processing.

18. The method of claim 12, wherein the silicide-source metal layer is formed from at least one of titanium, molybdenum, cobalt, and nickel.

19. The method of claim 17, wherein removing the unchanged portion of the silicide-source metal layer comprises wet etching using a metal etchant.

20. A method for manufacturing a semiconductor memory device, the method comprising:
(a) forming an isolation insulating layer in a semiconductor substrate to define a cell area and a peripheral circuit area and to define a device region in the cell area and the peripheral circuit area;
(b) forming a gate in the device region and defining source and drain regions;
(c) forming an interlevel dielectric layer on the gate and the source and drain regions and planarizing the interlevel dielectric layer;
(d) forming a self-aligned pattern on the interlevel dielectric layer and forming self-aligned contacts exposing the source and drain regions only in the cell area using a self-aligned process;
(e) forming contact pads by filling the self-aligned contacts with a conductive layer;
(f) thermally processing the conductive layer of the contact pads;
(g) fully removing the interlevel dielectric layer in the peripheral circuit area and in the cell area and forming junctions by implanting ions into the source and drain regions in the peripheral circuit area; and
(h) forming a metal silicide layer on at least one of the contact pads and at least one of the source and drain regions of the peripheral circuit area after fully removing the interlevel dielectric layer in the peripheral circuit area and the cell area.

21. The method of claim 20, wherein step (a) comprises:
forming an insulating mask layer on the semiconductor substrate;
forming a trench pattern in the insulating mask layer using photolithography and dry etching processes;
forming a trench using dry etching with the trench pattern serving as a mask; and
filling the trench with the isolation insulating layer.

22. The method of claim 21, wherein the insulating mask layer comprises a silicon oxide layer and a silicon nitride layer which are sequentially stacked.

23. The method of claim 22, wherein the silicon oxide layer is formed through thermal oxidation.

24. The method of claim 20, wherein the isolation insulating layer comprises a silicon oxide layer formed using chemical vapor deposition.

25. The method of claim 20, wherein step (b) comprises:
forming a gate dielectric layer in the device region exposed in the semiconductor substrate;
sequentially forming a gate conductive layer and an insulating mask layer on the gate dielectric layer;
forming a gate through the gate conductive layer and the insulating mask layer;
forming source and drain junctions in the cell area by implanting N-type dopants into the device regions of the cell area in the semiconductor substrate located on both sides of the gate to a low concentration; and
forming an insulating spacer on the sidewalls of the gate.

26. The method of claim 25, wherein the gate dielectric layer comprises one of a silicon oxide layer and a silicon oxynitride layer formed by thermal oxidation of silicon.

27. The method of claim 25, wherein the gate conductive layer is a composite layer of a doped polysilicon layer and a metal silicide layer.

28. The method of claim 27, wherein the metal silicide layer is a tungsten silicide layer.

29. The method of claim 27, wherein the metal silicide layer is one of a titanium silicide layer, a molybdenum silicide layer, and a cobalt silicide layer.

30. The method of claim 25, wherein the insulating mask layer is a silicon nitride layer formed using chemical vapor deposition.

31. The method of claim 25, wherein the N-type dopants are derived from one of phosphorous atoms and arsenic atoms.

32. The method of claim 25, wherein the insulating spacer is formed of silicon nitride.

33. The method of claim 20, wherein in step (c) the interlevel dielectric layer is formed of silicon oxide using chemical vapor deposition.

34. The method of claim 33, wherein the interlevel dielectric layer comprises an etch stopper.

35. The method of claim 33, wherein the etch stopper is a silicon nitride layer.

36. The method of claim 20, wherein in step (c) the interlevel dielectric layer is planarized using chemical mechanical polishing.

37. The method of claim 36, wherein the interlevel dielectric layer is polished away to a depth above the top of the gate.

38. The method of claim 20, wherein step (d) comprises:
coating a photoresist on the interlevel insulating layer and forming the self-aligned pattern in the photoresist; and
forming the self-aligned contacts exposing the source and drain regions in the cell area through the interlevel insulating layer using dry etching with the self-aligned pattern serving as a mask.

39. The method of claim 20, wherein step (e) comprises:
forming the conductive layer on the semiconductor substrate in and above the self-aligned contacts; and
removing the conductive layer so as to be level with the height of the interlevel dielectric layer.

40. The method of claim 39, wherein the conductive layer in and above the self-aligned contacts is formed of doped polysilicon.

41. The method of claim 39, wherein removing the conductive layer is performed using chemical mechanical polishing.

42. The method of claim 20, wherein step (f) comprises:
loading the semiconductor substrate into a thermal processing apparatus; and maintaining the thermal processing apparatus at a predetermined temperature above for a predetermined period of time.

43. The method of claim 42, wherein the thermal processing apparatus is one of an annealing furnace and a rapid thermal processor.

44. The method of claim 42, wherein the predetermined temperature is in the range of 700–900° C.

45. A method for manufacturing a semiconductor memory device, the method comprising:
(a) forming an isolation insulating layer in a semiconductor substrate to define a cell area and a peripheral circuit area and to define a device region in the cell area and the peripheral circuit area;
(b) forming a gate in the device region and defining source and drain regions;
(c) forming an interlevel dielectric layer on the gate and the source and drain regions and planarizing the interlevel dielectric layer;
(d) forming a self-aligned pattern on the interlevel dielectric layer and forming self-aligned contacts exposing the source and drain regions only in the cell area using a self-aligned process;
(e) forming contact pads by filling the self-aligned contacts with a conductive layer;
(f) thermally processing the conductive layer of the contact pads;
(g) fully removing the interlevel dielectric layer in the peripheral circuit area and forming junctions by implanting ions into the source and drain regions in the peripheral circuit area; and
(h) forming a metal silicide layer on at least one of the contact pads and the source and drain regions of the peripheral circuit area;
wherein step (g) comprises:
removing the interlevel dielectric layer on the gate and in the peripheral circuit area using wet etching;
depositing a photoresist on the semiconductor substrate;
forming in the photoresist a source/drain ion implantation pattern blocking the cell area and exposing the peripheral circuit area; and
forming the junctions by implanting the ions into the source and drain regions in the peripheral circuit area using the source/drain ion implantation pattern as a mask.

46. The method of claim 45, wherein the wet etching is performed using a fluoric acid-containing oxide etchant.

47. The method of claim 45, wherein the ions are derived from N-type atoms for an NMOS and are derived from P-type atoms for a PMOS.

48. The method of claim 45, before depositing the photoresist, further comprising forming an auxiliary spacer on an insulating spacer formed on the sidewalls of the gate in the peripheral circuit area.

49. The method of claim 48, wherein the auxiliary spacer is formed of silicon oxide.

50. The method of claim 45, before depositing the photoresist, further comprising:
forming a silicon insulating layer for the auxiliary spacer on the entire surface of the semiconductor substrate;
forming a photoresist pattern exposing one of the cell area and the peripheral cell area; and
etching back the silicon insulating layer using the photoresist pattern as an mask to form an auxiliary spacer on at least one of upper sidewalls of the contact pads and the sidewalls of an insulating spacer on the gate in the peripheral circuit area.

51. The method of claim 50, wherein the silicon insulating layer for the auxiliary spacer is formed of a silicon oxide layer.

52. A method for manufacturing a semiconductor memory device, the method comprising:
(a) forming an isolation insulating layer in a semiconductor substrate to define a cell area and a peripheral circuit area and to define a device region in the cell area and the peripheral circuit area;
(b) forming a gate in the device region and defining source and drain regions;
(c) forming an interlevel dielectric layer on the gate and the source and drain regions and planarizing the interlevel dielectric layer;
(d) forming a self-aligned pattern on the interlevel dielectric layer and forming self-aligned contacts exposing the source and drain regions only in the cell area using a self-aligned process;
(e) forming contact pads by filling the self-aligned contacts with a conductive layer;
(f) thermally processing the conductive layer of the contact pads;
(g) fully removing the interlevel dielectric layer in the peripheral circuit area and forming junctions by implanting ions into the source and drain regions in the peripheral circuit area; and
(h) forming a metal silicide layer on at least one of the contact pads and the source and drain regions of the peripheral circuit area;
wherein step (h) comprises:
exposing at least one of the surface of the contact pads and the surface of the source and drain regions of the peripheral circuit area;
forming a silicide-source metal layer on the surface of the semiconductor substrate;
thermally processing the semiconductor substrate at a predetermined temperature to change a portion of the silicide-source metal layer contacting a silicon source into a metal silicide layer; and
removing the other portion of the silicide-source metal layer remaining unreacted using a predetermined etching method.

53. The method of claim 52, wherein the silicide-source metal layer is formed of one material selected from the group consisting of titanium, molybdenum, cobalt, and nickel.

54. The method of claim 52, wherein the predetermined etching method is a wet etching method using a metal etchant.

55. The method of claim 54, wherein the metal etchant includes ammonium hydroxide ($NH_4OH$).

56. The method of claim 54, wherein the metal etchant includes sulfuric acid ($H_2SO_4$).

57. The method of claim 12, wherein step (c) further comprises:
(d) forming a dielectric layer on the gate structure before forming the contact pad;
(e) after forming the contact pad, removing the dielectric layer so that a portion of the contact pad protrudes above the gate structure.

58. A method of forming an integrated circuit device, the method comprising:
(a) forming a gate structure on a semiconductor substrate, wherein the gate structure comprises a gate insulating layer on the semiconductor substrate, a conductive gate electrode on the gate insulating layer opposite the semiconductor substrate, and an insulating mask layer on the conductive gate electrode opposite the semiconductor substrate;

(b) forming source/drain regions on opposite sides of the gate structure; and (c) forming a contact pad on at least one of the source/drain regions, wherein the contact pad comprises sidewalls extending away from the semiconductor substrate and a surface opposite the semiconductor substrate and wherein at least a portion of the sidewalls of the contact pad extends farther from the substrate than the insulating mask layer; and (d) forming a silicide cap on the contact pad, wherein a portion of the contact pad protrudes into the silicide cap and extends farther from the substrate that a portion of the silicide cap.

* * * * *